(12) United States Patent
Fattaruso et al.

(10) Patent No.: US 6,268,819 B1
(45) Date of Patent: Jul. 31, 2001

(54) BIT INTERPOLATION IN A RESISTOR STRING DATA CONVERTER

(75) Inventors: John W. Fattaruso, Dallas, TX (US); Shivaling S Mahant-Shetti, Kamataka (IN)

(73) Assignee: Texas Instruments Corporated, Dallas, TX (US)

( * ) Notice: Subject to any disclaimer, the term of this patent is extended or adjusted under 35 U.S.C. 154(b) by 0 days.

(21) Appl. No.: 09/342,878

(22) Filed: Jun. 29, 1999

(51) Int. Cl.$^7$ ........................................ H03M 1/78
(52) U.S. Cl. ..................... 341/154; 341/144; 341/155
(58) Field of Search ................... 341/154, 156, 341/136, 145, 144, 155, 159

(56) References Cited

U.S. PATENT DOCUMENTS

| | | | |
|---|---|---|---|
| 5,469,164 | * 11/1995 | Kemp | 341/145 |
| 5,489,904 | * 2/1996 | Hadidi | 341/156 |
| 5,619,203 | * 4/1997 | Gross, Jr. et al. | 341/145 |
| 5,977,898 | * 11/1999 | Ling et al. | 341/144 |

* cited by examiner

*Primary Examiner*—Howard L. Williams
*Assistant Examiner*—Jean Bruner Jeanglaude
(74) *Attorney, Agent, or Firm*—Pedro P. Hernandez; W. James Brady, III; Frederick J. Telecky, Jr.

(57) ABSTRACT

A data converter (20). The converter comprises an input ($I_0$–$I_3$) for receiving a digital word. The converter further comprises a string (22) of series connected resistive elements. The string comprises an integer number T of voltage taps (T0'–T8'). The converter further comprises an output ($V_{OUT2}$) for providing an integer number P of different analog voltage levels in response to the digital word. The integer number P is greater than the integer number T.

14 Claims, 6 Drawing Sheets

| I0 | I1 | I2 | I3 | C8 | C7 | C6 | C5 | C4 | C3 | C2 | C1 | C0 |
|---|---|---|---|---|---|---|---|---|---|---|---|---|
| 0 | 0 | 0 | 0 | 0 | 0 | 0 | 0 | 0 | 0 | 0 | 0 | 1 |
| 0 | 0 | 0 | 1 | 0 | 0 | 0 | 0 | 0 | 0 | 0 | 1 | 1 |
| 0 | 0 | 1 | 0 | 0 | 0 | 0 | 0 | 0 | 0 | 0 | 1 | 0 |
| 0 | 0 | 1 | 1 | 0 | 0 | 0 | 0 | 0 | 0 | 1 | 1 | 0 |
| 0 | 1 | 0 | 0 | 0 | 0 | 0 | 0 | 0 | 0 | 1 | 0 | 0 |
| 0 | 1 | 0 | 1 | 0 | 0 | 0 | 0 | 0 | 1 | 1 | 0 | 0 |
| 0 | 1 | 1 | 0 | 0 | 0 | 0 | 0 | 0 | 1 | 0 | 0 | 0 |
| 0 | 1 | 1 | 1 | 0 | 0 | 0 | 0 | 1 | 1 | 0 | 0 | 0 |
| 1 | 0 | 0 | 0 | 0 | 0 | 0 | 0 | 1 | 0 | 0 | 0 | 0 |
| 1 | 0 | 0 | 1 | 0 | 0 | 0 | 1 | 1 | 0 | 0 | 0 | 0 |
| 1 | 0 | 1 | 0 | 0 | 0 | 0 | 1 | 0 | 0 | 0 | 0 | 0 |
| 1 | 0 | 1 | 1 | 0 | 0 | 1 | 1 | 0 | 0 | 0 | 0 | 0 |
| 1 | 1 | 0 | 0 | 0 | 0 | 1 | 0 | 0 | 0 | 0 | 0 | 0 |
| 1 | 1 | 0 | 1 | 0 | 1 | 1 | 0 | 0 | 0 | 0 | 0 | 0 |
| 1 | 1 | 1 | 0 | 0 | 1 | 0 | 0 | 0 | 0 | 0 | 0 | 0 |
| 1 | 1 | 1 | 1 | 1 | 1 | 0 | 0 | 0 | 0 | 0 | 0 | 0 |

FIG. 5a

| I0 | I1 | I2 | I3 | I4 | ASSERTED COLUMN(S) | | | SITUATION |
|---|---|---|---|---|---|---|---|---|
| 0 | 0 | 0 | 0 | 0 | | | C0 | 1 |
| 0 | 0 | 0 | 0 | 1 | C3 | C1 | C0 | 2 |
| 0 | 0 | 0 | 1 | 0 | | C2 | C1 | 3 |
| 0 | 0 | 0 | 1 | 1 | C3 | C2 | C0 | 4 |
| 0 | 0 | 1 | 0 | 0 | | | C3 | 1 |
| 0 | 0 | 1 | 0 | 1 | C4 | C3 | C2 | 2 |
| 0 | 0 | 1 | 1 | 0 | | C5 | C2 | 3 |
| 0 | 0 | 1 | 1 | 1 | C5 | C4 | C3 | 4 |
| 0 | 1 | 0 | 0 | 0 | | | C4 | 1 |
| 0 | 1 | 0 | 0 | 1 | C7 | C5 | C4 | 2 |
| 0 | 1 | 0 | 1 | 0 | | C6 | C5 | 3 |
| 0 | 1 | 0 | 1 | 1 | C7 | C6 | C4 | 4 |
| 0 | 1 | 1 | 0 | 0 | | | C7 | 1 |
| 0 | 1 | 1 | 0 | 1 | C8 | C7 | C6 | 2 |
| 0 | 1 | 1 | 1 | 0 | | C9 | C6 | 3 |
| 0 | 1 | 1 | 1 | 1 | C9 | C8 | C7 | 4 |
| 1 | 0 | 0 | 0 | 0 | | | C8 | 1 |
| 1 | 0 | 0 | 0 | 1 | C11 | C9 | C8 | 2 |
| 1 | 0 | 0 | 1 | 0 | | C10 | C9 | 3 |
| 1 | 0 | 0 | 1 | 1 | C11 | C10 | C8 | 4 |
| 1 | 0 | 1 | 0 | 0 | | | C11 | 1 |
| 1 | 0 | 1 | 0 | 1 | C12 | C11 | C10 | 2 |
| 1 | 0 | 1 | 1 | 0 | | C13 | C10 | 3 |
| 1 | 0 | 1 | 1 | 1 | C13 | C12 | C11 | 4 |
| 1 | 1 | 0 | 0 | 0 | | | C12 | 1 |
| 1 | 1 | 0 | 0 | 1 | C15 | C13 | C12 | 2 |
| 1 | 1 | 0 | 1 | 0 | | C14 | C13 | 3 |
| 1 | 1 | 0 | 1 | 1 | C15 | C14 | C12 | 4 |
| 1 | 1 | 1 | 0 | 0 | | | C15 | 1 |
| 1 | 1 | 1 | 0 | 1 | C16 | C15 | C14 | 2 |
| 1 | 1 | 1 | 1 | 0 | | C17 | C14 | 3 |
| 1 | 1 | 1 | 1 | 1 | C17 | C16 | C15 | 4 |

BIT INTERPOLATION IN A RESISTOR STRING DATA CONVERTER

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to data converters, and are more particularly directed to converters using resistor strings.

Data converters may be used in various types of electronic circuits, or may be formed as a single integrated circuit device. Such converters typically take one of two forms, either as a digital-to-analog converter ("DAC") or an analog-to-digital converter ("ADC"). For the DAC, its operation converts an input digital signal to an output analog signal, typically where the amplitude of the output analog signal corresponds directly to the magnitude of the input digital signal Conversely, the ADC converts an input analog signal to an output digital signal, typically where the value of the output digital signal corresponds directly to the amplitude of the input analog signal. In many configurations, both DACs and ADCs implement a resistor string that includes a number of series-connected resistors, where each resistor provides a voltage tap at each of its ends. Indeed, often an ADC includes a DAC within the overall ADC configuration. In any event, the overall resistor string typically is biased at opposing ends by two different reference voltages, for example where one such voltage may be a positive voltage and the other is ground. Accordingly, the resistor string forms a voltage dividing network and each of the voltage taps is accessible as part of the operation for the data conversion (i.e., either from digital to analog, or analog to digital). Given this functionality, the relevant art teaches that a common concern is to endeavor to ensure that the overall device is as small and as fast as possible. The present embodiments are directed to this concern and, in providing a solution to same, improve both DAC and ADC technology.

For further background to converters and by way of example, FIG. 1 illustrates a typical configuration of a prior art DAC 10, and is detailed briefly below. In addition, since the primary focus of the preferred embodiments described later is directed to resistor strings as used in either a DAC or an ADC, the following discussion provides one example of such a string as used in a DAC, but is not unduly lengthened by also providing a detailed analysis of an ADC. Instead, such an understanding is left to one skilled in the art.

Turning to DAC 10 of FIG. 1, it includes a series-connected resistor string designated generally at 12. By way of example and as appreciated later, DAC 10 is a 3 input 8 output DAC, while numerous other dimensions may exists for different DAC configurations. For the current example of a 3-to-8 DAC, resistor string 12 includes seven resistive elements shown as R0 through R6. Resistive elements R0 through R6 may be formed using various techniques, where the particular technique is not critical to the present inventive teachings. The relevant art teaches, however, that regardless of the technique used to form the resistive elements, a common concern is to endeavor to ensure that each resistive element has as close to the same resistance value as all other resistors in the string. Moreover, a voltage source $V_{S1}$ is applied across resistor string 12, and may be of any suitable biasing voltage, which for current applications is typically on the order of two volts. Thus, given the equal resistance of each element in the string, the voltage division across the resistors is uniform.

Looking to the detailed connections with respect to the resistive elements in string 12, each resistive element provides two taps from which a voltage may be measured as detailed below. For example, looking to the bottom of FIG. 1, resistive element R1 provides a tap T0 and a tap T1, while resistive element R2 shares the same tap T1 and provides another tap T2, and so forth. Each tap has a switching device connected between it and an output node, $V_{OUT1}$. In the current example, each of these switching devices is an n-channel field effect transistor, although in an alternative embodiment all of the switching devices may be p-channel transistors. In any event, each switching device is labeled for convenience by combining the abbreviation ST (i.e., switching transistor) with the same numeric identifier corresponding to the tap to which a first source/drain of the transistor is connected. For example, a first source/drain of transistor ST0 is connected to tap T0, a first source/drain of transistor ST1 is connected to tap T1, and so forth. The gate of each of transistors ST0 through ST7 is connected to receive a control signal from a decoder 14. Decoder 14 is connected to receive a 3-bit digital input at corresponding inputs $I_0$ through $I_2$, and to enable one of eight output conductors, C0 through C7, in an output bus 16, as further detailed below.

The operation of DAC 10 is as follows. A 3-bit digital word is connected to inputs $I_0$ through $I_2$ of decoder 14, and it includes sufficient logic circuitry or the like to respond by enabling only one of the eight output conductors, C0 through C7, in output bus 16. In a simple case, therefore, the numeric identifiers of the conductors in bus 16 may be thought of as corresponding to the value of the digital word, that is, the corresponding numbered conductor is asserted in response to the magnitude of the 3-bit digital word. For example, if the 3-bit digital word equals 001, then conductor C1 of bus 16 is enabled. Once a conductor in bus 16 is asserted, which in the current example occurs by asserting the conductor logically high, it enables the single switching transistor to which it is connected. By way of illustration of this operation, and continuing with the example of conductor C1 of bus 16 being asserted, it therefore places a logic high signal at the gate of switching transistor ST1, which in response provides a conductive path between tap T1 and output node $V_{OUT1}$. In addition, recall that the voltage source $V_{S1}$, is evenly divided across resistor string 12; consequently, by enabling transistor ST1, then the divided voltage at tap T1 is coupled to output node $V_{OUT1}$. Accordingly, the digital input of 001 has been converted to an analog voltage which equals this divided voltage. Using common voltage division as provided by a series of resistors such as in string 12, for the current example this voltage is that across resistive element R0 and, therefore, equals 1/7* $V_{S1}$.

Given the above, one skilled in the art will further appreciate that with different digital inputs, any of the transistors of DAC 10 may be enabled, and for each such transistor it will correspondingly cause an output which represents a divided voltage between 0 volts or any value incrementing up from 0 volts by $1/7V_{S1}$, and up to an output equal to $V_{S1}$. From this observation and for purposes of later contrast to the preferred embodiments, note that the number of possible different analog output voltages of DAC 10 (i.e., 8 different voltages) necessarily includes the same number of taps as are provided by that DAC, that is, the same number of connections provided by the series resistance string.

The configuration of DAC 10 has been accepted in various contexts, however it provides certain drawbacks. Particularly, due to the requirement of equal resistance for elements R0 through R7, one approach has been to form them along a single continuous line as depicted schematically in FIG. 1. However, for larger decoders, this may provide for too large a device and, thus, an alternative is to provide a back-and-forth resistance string, sometimes referred to as a meander, in an effort to reduce the span of the resistance string. With the meander, however, there arises complications in the efforts to maintain the resistance of each element at the same value, particularly given that those configurations may include corner elements which are different in shape than the non-cornering elements. In addition, it is often the goal of an integrated circuit to be made smaller, and this goal may well apply to a converter, either alone or in combination with other circuitry on the same single integrated circuit Still further, the integral non-linearity ("INL") of a larger circuit may be greater due to variances of device characteristics on one side of the circuit versus those on another side of the circuit. Still further, it is desirable to reduce the overall size of the converter to reduce internal impedances, and because reduced size often equates to a faster device. In view of these drawbacks and goals, there arises a need to provide an improved converter configuration, as is achieved by the preferred embodiments discussed below.

BRIEF SUMMARY OF THE INVENTION

In the preferred embodiment, there is a data converter. The converter comprises an input for receiving a digital word. The converter further comprises a string of series connected resistive elements. The string comprises an integer number T of voltage taps. The converter further comprises an output for providing an integer number P of different analog voltage levels in response to the digital word. The integer number P is greater than the integer number T. Other circuits, systems, and methods are also disclosed and claimed.

BRIEF DESCRIPTION OF THE SEVERAL VIEWS OF THE DRAWINGS

FIG. 5a illustrates a truth table for the preferred operation of the decoder of DAC 30 in FIG. 4;

FIG. 5b illustrates a consolidated table of the truth table of FIG. 5a, where for FIG. 5b only the asserted output columns are shown and are classified according to one of four different situations which may arise from the switching elements connected between each tap and the output;

DETAILED DESCRIPTION OF THE INVENTION

Figure 1:
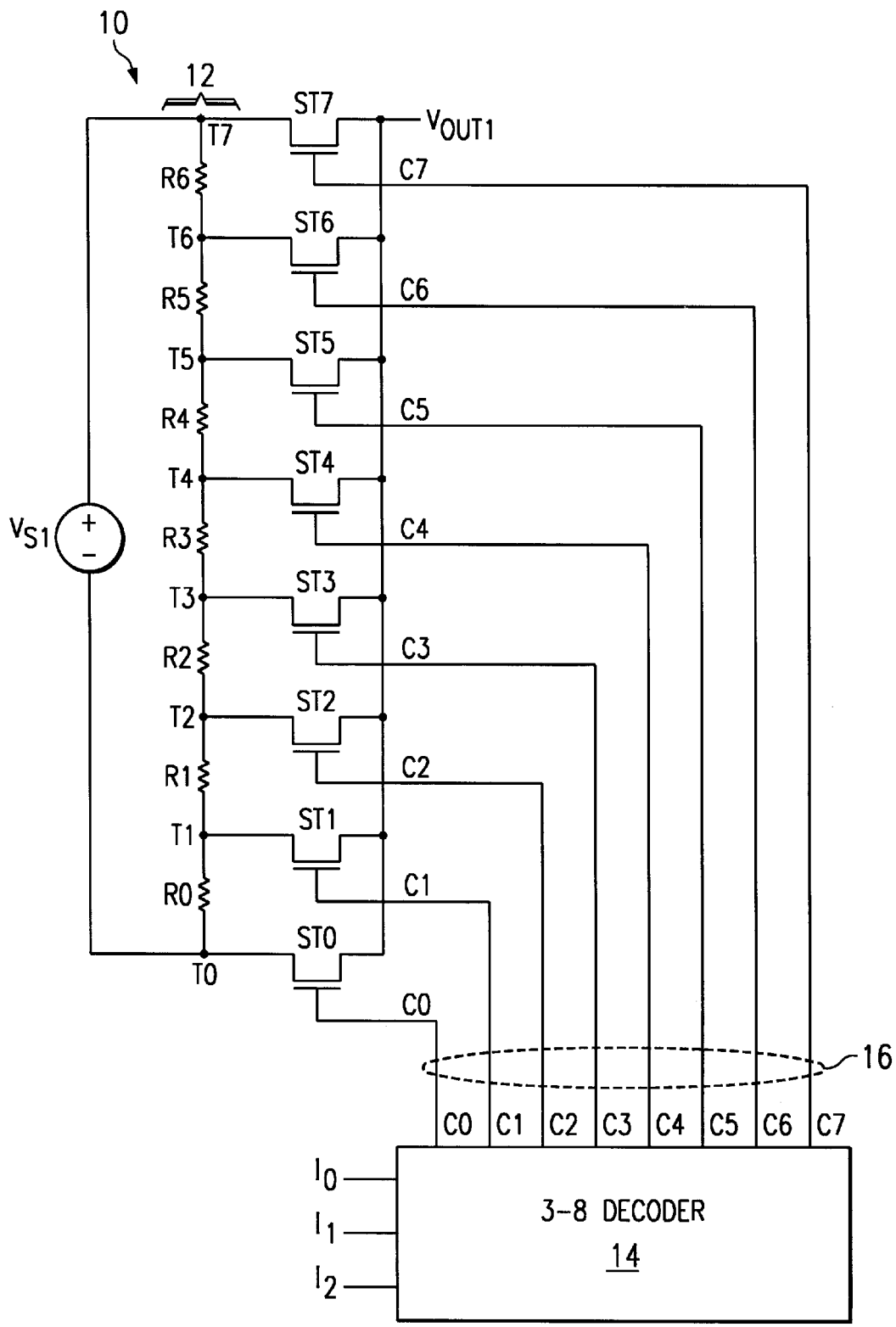
FIG. 1 illustrates a schematic of a prior art digital-to-analog converter ("DAC")

FIG. 1 was described in the preceding Background of the Invention section of this document and in connection with the prior art.

Figures 2, 3:
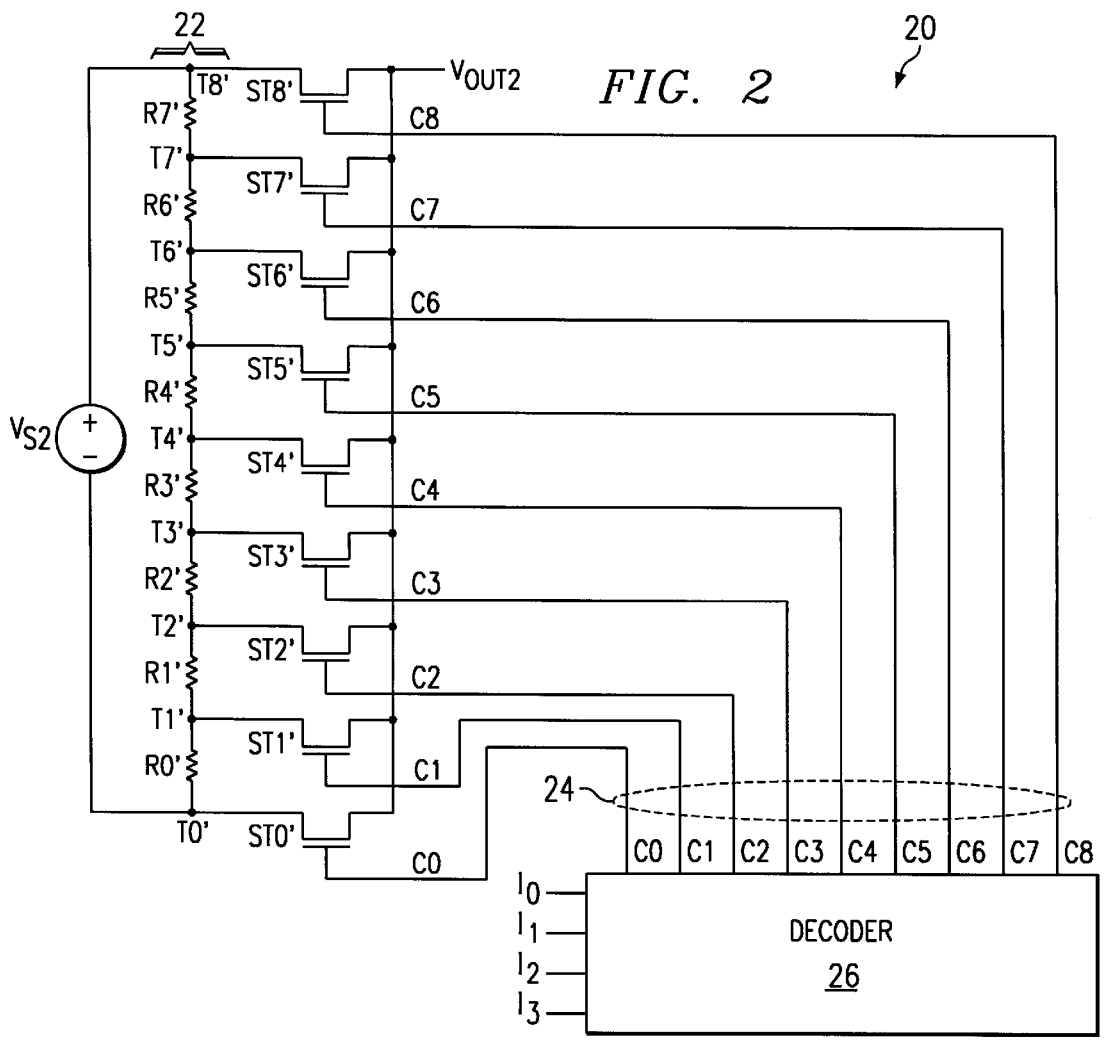
FIG. 2 illustrates a schematic of a first inventive DAC operable to produce double the output capacity of the prior art DAC of FIG. 1 by interpolating voltages between tap voltages.
FIG. 3 illustrates a truth table for the preferred operation of the decoder of DAC 20 in FIG. 2.

FIG. 2 illustrates a schematic of a DAC 20 according to a first inventive embodiment DAC 20 includes many components which are comparable in formation and connection to components in DAC 10 of FIG. 1. To illustrate these like components, they are shown with the same reference identifiers as in FIG. 1, with the exception that an apostrophe is added to the identifier. In addition, and for reasons evident later, DAC 20 includes an additional resistor, tap, and switching transistor as compared to DAC 10. Briefly reviewing the elements of DAC 20, and assuming the reader is familiar with DAC 10, DAC 20 includes a series-connected resistor string 22 having eight resistive elements R0' through R7', across which is connected a voltage source $V_{S2}$, and where the resistive elements may be formed using various techniques known in the art. In addition, each resistive element R0' through R7' connects to a pair of taps, thereby forming a total of nine taps T0' through T8'. Each of taps T0' through T8' has a corresponding switching transistor, ST0' through ST8', connected between the tap and an output node $V_{OUT2}$. The switching transistors are preferably n-channel field effect transistors, although other devices may be substituted for these transistors. Lastly, a bus 24 includes nine conductors, each of which is connected to a gate of a corresponding one of switching transistors ST0' through ST8'.

A key distinction between DAC 20 in FIG. 2 and DAC 10 of the prior art arises from decoder circuit 26. Specifically, decoder circuit 26 includes four inputs, designated I0 through I3, with only one additional output conductor, C8, in its bus 24. Thus, here an additional input is provided in contrast to DAC 10, and from this input and the details of decoder 26 there is a corresponding doubling in the number of outputs available at output node $V_{OUT2}$. This increase in capacity is further explored below, first by examining decoder 26 into greater detail, and then following with an operational description of DAC 20 in its entirety.

FIG. 3 illustrates a truth table for the preferred signal operation of decoder circuit 26. From this table as well as the following discussion, one skilled in the art may develop various circuit implementations, such as using Karnaugh maps or the like, to implement a logic or other circuit design for achieving the illustrated input/output relationships. Turning then to those relationships, FIG. 3 illustrates that the four inputs to decoder circuit 26 are permitted to provide any of sixteen different input combinations (i.e., 0000 through 1111), and in response decoder 26 produces a corresponding one of sixteen different output combinations. More particularly, FIG. 3 illustrates that for any one set of inputs, the output of decoder circuit 26 may be characterized as one of two types of situations: (1) an assertion of a single one of conductors C0 through C8; or (2) an assertion of a two consecutive ones of conductors C0 through C8. As an example of situation (1), if the input is 0000, then the output asserts only conductor C0. As an example of situation (2), if the input is 0001, then the output asserts consecutive conductors C0 and C1. The result of these two situations is further appreciated by returning to FIG. 2, as is done immediately below.

Returning to DAC 20 of FIG. 2, note that the signal output variations in the FIG. 3 truth table correspond to the output possibilities of DAC 20. More specifically, DAC 20 may operate to output sixteen different output voltages in response to the corresponding sixteen different input combinations of $I_0$ through $I_3$. As an illustration, the following discussion again considers the examples of situations (1) and (2) of the preceding paragraph, and now relates those to the operation of DAC 20.

In situation (1), recall an earlier example is provided where the input is 0000 and the output asserts only conductor C0. In this case, transistor ST0' is enabled. Consequently, the voltage at tap T0' is connected to the output node $V_{OUT2}$. This situation, therefore, is the same as the operation of DAC 10 of the prior art when its conductor C0 is asserted.

In situation (2), recall that an earlier example is provided where the input is 0001 and output asserts consecutive conductors C0 and C1. Consequently, both transistors ST0' and ST1' conduct. As a result, a voltage loop is formed, which includes resistive element R0' as well as both conducting transistors ST0' and ST1'. In this regard, it is now noted that in the present embodiment the resistance of each of the switching transistors is preferably equal to one another, as may be accomplished using replication. Further in the preferred embodiment, the resistance of each of the switching transistors when conducting is considerably higher than the resistance of the resistive elements R0' through R7'. For example, preferably the resistance of each of the switching transistors is on the order of ten to one hundred times larger than the resistance of the resistive elements R0' through R7'. Given the relative resistance values set forth above, and returning to the operation of DAC 20 in situation (2), the output voltage may be approximated by noting that resistance of element R0' may be considered negligible; thus, the concurrent conduction of transistors ST0' and ST1' effectively halves the total voltage at tap T1', that is, the output voltage at output node $V_{OUT2}$ equals approximately $\frac{1}{2} * V_{(tap\ T1')}$ (assuming the potential at tap T0' is ground). In other words, with sufficient gate voltage, the two switching transistors are guaranteed to be in a linear region and, therefore, exhibit similar resistance. Moreover, because the resistance of these conducting transistors is much larger than that of the resistive element between the taps to which the transistors are connected, then the disturbance on the current in the resistive element is negligible. Thus, the operation for situation (2) in effect creates a level of interpolation between the voltage at tap T0' and the voltage at tap T1'. In other words, the output voltage for situation (2) is approximately half way between the voltage at tap T0' at the voltage tap adjacent to it, namely, tap T1'. Moreover, by examining the remaining situations provided by the truth table of FIG. 3, it will be apparent that the remaining values therein permit a total of sixteen different output voltages, where each voltage equals either the voltage at a given one of taps T0' through T7', or equals a voltage approximately equal to the half way voltage between two adjacent (ie., consecutively numbered) taps. As a result, the interpolation in effect gives rise to an additional bit of output possibilities.

From the above, it is now instructive to note various additional observations and advantages of the embodiment of FIG. 2. For example, note that the number of possible output voltages provided by the described embodiment far exceeds the number of its taps. Further, DAC 20 includes only one more resistive element than DAC 10, yet DAC 20 provides double the input and output capacity in terms of the number of binary inputs and corresponding levels of voltages which are outputted in response to those inputs. Consequently, the size and attention required of the resistor string, which tends to be the most difficult component of the device in terms of manufacturing, is approximately the same as that of the prior art, while the input/output capacity is doubled. Additionally, while the preceding is described in connection with DAC 20, it may be applied to resistor strings in other DAC or ADC converters as will be appreciated by one skilled in the art, and further in view of the additional embodiments described below.

Figure 4:
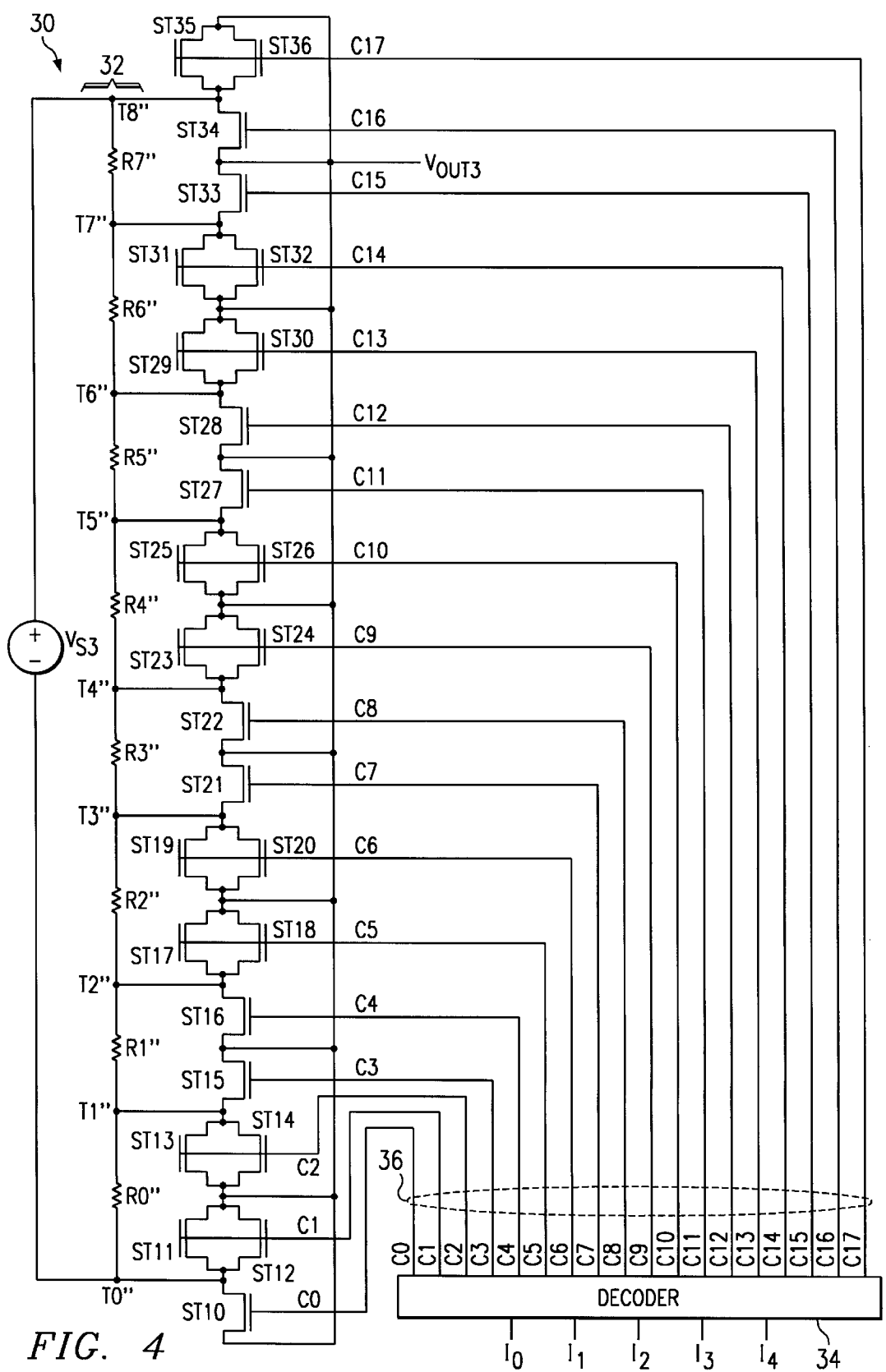
FIG. 4 illustrates a schematic of a second inventive DAC operable to produce four times the output capacity of the prior art DAC of FIG. 1 by interpolating voltages between tap voltages.

FIG. 4 illustrates a schematic of a DAC 30 according to another inventive embodiment DAC 30 includes many components which are comparable in formation and connection to components in DAC 20 of FIG. 2 and, to illustrate these like components, they are shown with the same reference identifiers as used in FIG. 2, with the exception that double apostrophes are shown with the identifier in FIG. 3. In addition, and for reasons evident later, DAC 20 includes numerous additional switching transistors and, to distinguish the transistors in general, they are numbered in ascending order starting with a switching transistor ST10, as detailed later. Briefly first reviewing the elements of DAC 30 that are similar to those of DAC 20, and assuming the reader is familiar with DAC 20, DAC 30 includes a series-connected resistor string 32 having eight resistive elements R0" through R7", across which is connected a voltage source $V_{S3}$. In addition, each resistive element R0" through R7" connects to a pair of taps, thereby forming a total of nine taps T0" through T8".

A key distinction between DAC 30 in FIG. 4 and DAC 20 of FIG. 2 arises from a decoder circuit 34, its 18-conductor bus 36, and the switching transistors connected to the conductors of bus 36. Specifically, decoder circuit 34 includes five inputs, designated $I_0$ through $I_4$ and, as shown below, is operable to selectively assert the conductors of bus 36 to cause corresponding ones of the switching transistors to conduct, thereby providing up to 32 different output voltages at output node $V_{OUT3}$. Before detailing the operation in this regard, it is first instructive to examine the connections with respect to the switching transistors and bus 36. Each of taps T0" through T8" is connected to the output node $V_{OUT3}$ via three switching transistors. As in the case for DAC 20 and for reasons understood later, in DAC 30 the resistance of each of the switching transistors when enabled is preferably equal to one another, and also the resistance of each of the switching transistors when enables is on the order of ten to one hundred greater than the resistance of the resistive elements R0" through R7". Looking now in greater detail to the connections concerning each tap and its three associated switching transistors, of these three transistors, two are connected in parallel such that their first source/drains are connected to a tap while their second source/drains are connected to output node $V_{OUT3}$, and the gates of these two transistors are connected to one another. For purposes of reference in the remainder of this document, these transistors are referred to as paired and parallel-connected transistors. Looking to tap T0" by way of example, it is connected to the first source/drains of paired and parallel-connected transistors ST11 and ST12, with the second source/drains of transistors ST11 and ST12 connected to output node $V_{OUT3}$ and the gates of transistors ST11 and ST12 connected to conductor C1. Turning now to the third transistor of the three transistors pertaining to each tap, it has a first source/drain connected to the tap, a second source/drain connected to output node $V_{OUT3}$, and its gate connected to a corresponding one of the conductors in bus 36. Looking again to tap T0" by way of example, this third transistor is shown as transistor ST10, which has a first source/drain connected to tap T0", a second source/drain connected to output node $V_{OUT3}$, and its gate connected to conductor C0.

Given the above, note two additional observations. First, the examples of the preceding paragraph as well as the previous description should demonstrate to one skilled in the art that a comparable three transistor connection exists for each of the taps in DAC 30. Briefly as another example, therefore, tap T1" is connected via three transistors to output node $V_{OUT3}$, where two of those transistors are paired and parallel-connected transistors ST13 and ST14 connected in parallel with their gates connected to a same conductor C2, and where a third of those transistors is transistor ST15 which has its gate connected to a different conductor C3. Second, for each three transistor combination of this sort, all three transistors are connected in parallel with respect to one another. This point is particularly relevant for purposes of later appreciating the effect of this parallel connection on the output voltage provided at output node $V_{OUT3}$.

Figure 5A:
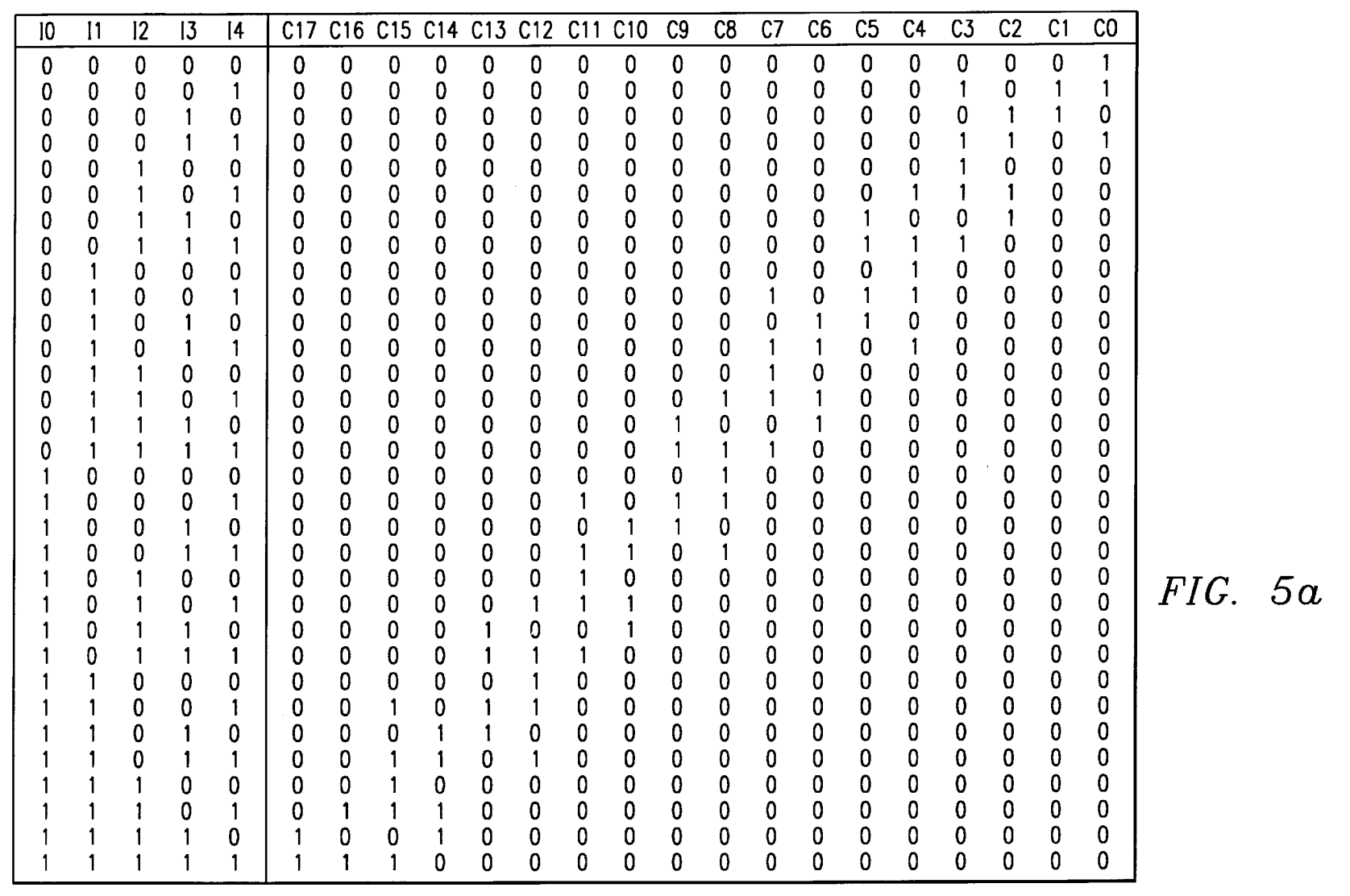

FIG. 5a illustrates a truth table for the preferred signal operation of decoder circuit 34 in FIG. 4, and FIG. 5b discussed later summarizes the asserted outputs shown in the truth table of FIG. 5a. Looking then to the truth table of FIG. 5a as well as the following discussion, again one skilled in the art may develop various circuit implementations to implement a circuit design for achieving the illustrated input/output relationships. Turning then to those relationships, FIG. 5a illustrates that the five inputs to decoder circuit 26 are permitted to provide any of thirty-two different combinations (i.e., 00000 through 11111), and in response decoder 34 produces a corresponding one of thirty-two different output combinations. More particularly and as detailed later, FIG. 5a illustrates that for any one set of inputs, the output of decoder circuit 34 will be such that corresponding ones of the switching transistors are enabled in one of four types of situations: (1) an assertion of a single one of the conductors in bus 36 to enable only a single transistor connected between a tap and output node $V_{OUT3}$; (2) an assertion of three of the conductors in bus 36 to enable all three transistors connected between a tap and output node $V_{OUT3}$ and also to enable a single transistor connected between the next higher order tap and output node $V_{OUT3}$; (3) an assertion of two of the conductors in bus 36 to enable the paired and parallel-connected transistors connected between a tap and output node $V_{OUT3}$ and also to enable the paired and parallel-connected transistors connected between the next higher order tap and output node $V_{OUT3}$; and (4) an assertion of three of the conductors in bus 36 to enable a single transistor connected between a tap and output node $V_{OUT3}$ and also to enable all three transistors connected between the next higher order tap and output node $V_{OUT3}$. Each of these four situations is further appreciated by way of examples, as are set forth immediately below.

Turning to the first situation provided by an output of decoder circuit 34, recall that it involves an assertion of a single one of the conductors in bus 36 to enable only a single transistor connected between a tap and output node $V_{OUT3}$. An example is shown in the first line of the tables of FIGS. 5a and 5b and, indeed, in FIG. 5b, is identified in a "situation" column as situation 1. In the first line of these tables, it is therefore shown that conductor C0 is enabled. Returning now to FIG. 4 to appreciate situation 1, when conductor C0 is asserted, only transistor ST10 conducts. In other words, only a single transistor ST10 connected between tap T0" and output node $V_{OUT3}$ conducts. Having established this, to further appreciate the present embodiment, attention is now directed to the output voltage with results in situation 1. More particularly, since only a single transistor is conducting, then the voltage at output node $V_{OUT3}$ equals approximately the same voltage than at the tap to which a source/drain of the conducting transistor is connected. In the example of transistor ST10, therefore, $V_{OUT3}$ equals the voltage at tap T0". For purposes of later reference, this relationship is shown by the following Equation 1:

$$V_{OUT3} = V_{TAP} \qquad \text{Equation 1}$$

Turning to the second situation provided by an output of decoder circuit 34, recall that it involves an assertion of three of the conductors in bus 36 to enable all three transistors connected between a tap and output node $V_{OUT3}$ and also to enable a single transistor connected between the next higher order tap and output node $V_{OUT3}$. An example is shown in the second line of the tables of FIGS. 5a and 5b and is identified as situation 2 in FIG. 5b. In the second line of these tables, it is therefore shown that conductors C0, C1, and C3 are enabled. Returning now to FIG. 4 to appreciate situation 2, when conductors C0 and C1 are asserted, all three transistors ST10, ST11, and ST12 connected to tap T0" conduct. In addition, since C3 is asserted, a single transistor ST15 connected between the next higher order tap, T1", and output node $V_{OUT3}$, also conducts.

Figure 6A:
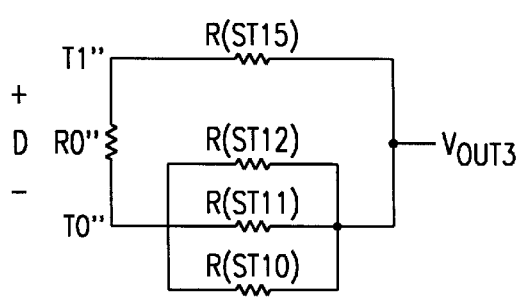
FIG. 6a illustrates an equivalent resistance network corresponding to situation 2 identified in the table of FIG. 5b.

By way of further illustration, FIG. 6a illustrates the resulting resistance network created by the four conducting transistors for situation 2 and, more particularly, for the example of the preceding paragraph relative to tap T0". Specifically, between tap T0" and output node $V_{OUT3}$ are connected three parallel resistances corresponding to transistors ST10, ST11, and ST12, and between tap T1" and output node $V_{OUT3}$ is connected a single resistance corresponding to transistor ST15. Recall from above that the resistance of each switching transistor is substantially the same. For purposes of discussion, let this value be identified as R. Consequently, the three parallel resistances between tap T0" and output node $V_{OUT3}$ provide a resistance equal to R/3, and the single resistance between tap T1" and output node $V_{OUT3}$ provides a resistance equal to R. If the differential voltage between taps T1" and T0" is identified as D, as shown in FIG. 6a, then by voltage division the voltage at output node $V_{OUT3}$ may be defined as the voltage across the three parallel resistances relative to tap T0", as shown in the following Equation 2:

$$V_{OUT3} = D\left(\frac{R/3}{R/3 + R}\right) = D\left(\frac{R}{R + 3R}\right) = D\left(\frac{R}{4R}\right) = \frac{D}{4} \qquad \text{Equation 2}$$

Accordingly, from Equation 2, one skilled in the art will appreciate that for situation 2, the voltage at output node $V_{OUT3}$ equals the voltage at tap T0" increased by a voltage of D/4.

Turning to the third situation provided by an output of decoder circuit 34, recall that it involves an assertion of two of the conductors in bus 36 to enable the paired and parallel-connected transistors connected between a tap and output node $V_{OUT3}$ and also to enable the paired and parallel-connected transistors connected between the next higher order tap and output node $V_{OUT3}$. An example is shown in the third line of the tables of FIGS. 5a and 5b and is identified as situation 3 in FIG. 5b. In the third line of these tables, it is therefore shown that conductors C1 and C2 are enabled. Returning now to FIG. 4 to appreciate situation 3, when conductor C1 is asserted, the paired and parallel-connected transistors ST11 and ST12 connected to tap T0" conduct, and at the same time when conductor C2 is asserted, the paired and parallel-connected transistors ST13 and ST14 connected to tap T1" conduct.

Figure 6B:
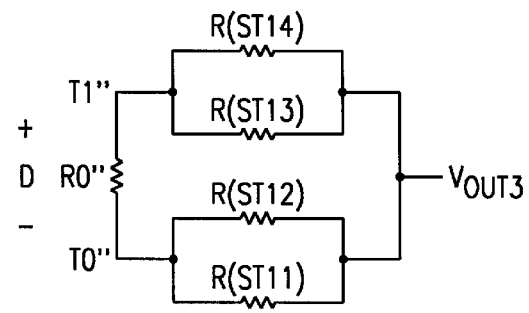
FIG. 6b illustrates an equivalent resistance network corresponding to situation 3 identified in the table of FIG. 5b.

By way of further illustration, FIG. 6b illustrates the resulting resistance network created by the two sets of conducting paired and parallel-connected transistors for situation 3 and, more particularly, for the example of the preceding paragraph relative to tap T0". Specifically, between tap T0" and output node $V_{OUT3}$ are connected two parallel resistances corresponding to transistors ST11 and ST12, and between tap T1" and output node $V_{OUT3}$ is connected two parallel resistances corresponding to transistors ST13 and ST14. Again, since the resistance of each switching transistor is substantially the same, then each set of paired and parallel-connected transistors provides a resistance between a tap and $V_{OUT3}$ equal to R/2. Therefore, by voltage division the voltage at output node $V_{OUT3}$ may be defined as the voltage across the paired and parallel-connected transistors relative to tap T0", as shown in the following Equation 3:

$$V_{OUT3} = D\left(\frac{R/2}{R/2 + R/2}\right) = D\left(\frac{R}{R+R}\right) = D\left(\frac{R}{2R}\right) = \frac{D}{2} \quad \text{Equation 3}$$

Accordingly, from Equation 3, one skilled in the art will appreciate that for situation 3, the voltage at output node $V_{OUT3}$ equals the voltage at tap T0" increased by a voltage of D/2.

Turning to the fourth situation provided by an output of decoder circuit 34, recall that it involves an assertion of three of the conductors in bus 36 to enable a single transistor connected between a tap and output node $V_{OUT3}$ and also to enable all three transistors connected between the next higher order tap and output node $V_{OUT3}$. An example is shown in the fourth lines of the tables of FIGS. 5a and 5b and is identified as situation 4 in FIG. 5b. In the fourth line of these tables, it is therefore shown that conductors C0, C2, and C3 are enabled. Retuning now to FIG. 4 to appreciate situation 4, when conductor C0 is asserted, a single transistor ST10 connected between tap T1' and output node $V_{OUT3}$ conducts. In addition, when C2 and C3 are asserted, all three transistors ST13, ST14, and ST15 connected to the next higher ordered tap T1" conduct.

Figure 6C:
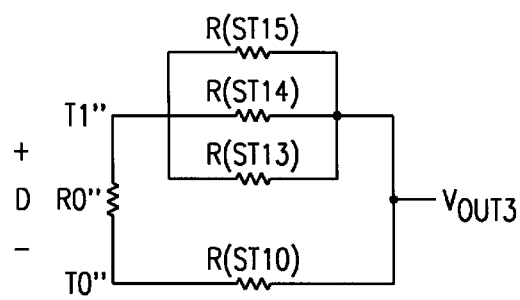
FIG. 6c illustrates an equivalent resistance network corresponding to situation 4 identified in the table of FIG. 5b.

By way of further illustration, FIG. 6c illustrates the resulting resistance network created by the conducting transistors for situation 4 and, more particularly, for the example of the preceding paragraph relative to tap T0". Specifically, between tap T0" and output node $V_{OUT3}$ is connected a single resistance corresponding to transistor ST10, and between tap T1" and output node $V_{OUT3}$ is connected three parallel resistances corresponding to transistors ST13, ST14, and ST15. Once more, since the resistance of each switching transistor is substantially the same, the single resistance between T0" and output node $V_{OUT3}$ provide a resistance equal to R, and the three parallel resistances between tap T1" and output node $V_{OUT3}$ provides a resistance equal to R/3. Consequently, by voltage division the voltage at $V_{OUT3}$ may be defined as the voltage across the single resistance relative to tap T0", as shown in the following Equation 4:

$$V_{OUT3} = D\left(\frac{R/3}{R + R/3}\right) = D\left(\frac{3R}{3R + R}\right) = D\left(\frac{3R}{4R}\right) = \frac{3D}{4} \quad \text{Equation 4}$$

Accordingly, from Equation 4, one skilled in the art will appreciate that for situation 4, the voltage at output node $V_{OUT3}$ equals the voltage at tap T0" increased by a voltage of 3D/4.

Having reviewed each of the four situations that may occur for a given tap in DAC 30, it is now instructive to note various additional observations and advantages of the embodiment of FIG. 4. For example, for each tap having a resistive element connecting it to a higher ordered tap, a total of four different voltage levels may be output relative to that tap, as shown by Equations 1 through 4. More particularly, these voltage consist of the voltage at the tap, or that voltage increased by ¼D, ½D, or ¾D. In other words, the additional switching transistors and control thereof permit a multiple level interpolation between tap voltages, where in the example of DAC 30 the interpolation levels are at increments of one-fourth the tap voltage. Moreover, since DAC 30 includes eight taps which have a resistive element connecting the tap to a higher ordered tap (tap T8" is not connected to such a higher ordered tap), then a total of 32 different outputs are provided. In other words, the interpolation in effect gives rise to an additional two bits of output possibilities. Thus, once again the number of possible output voltages provided by the described embodiment far exceeds its number of taps. Further, DAC 30 includes only one more resistive element than DAC 10, yet DAC 30 provides four times the output capacity in terms of the number of binary inputs and corresponding levels of voltages which are outputted in response to those inputs. As a result, and in even greater fashion than DAC 20, the size and attention required of the resistor string is approximately the same as that of the prior art, while the input/output capacity is greatly enhanced.

Figure 7:
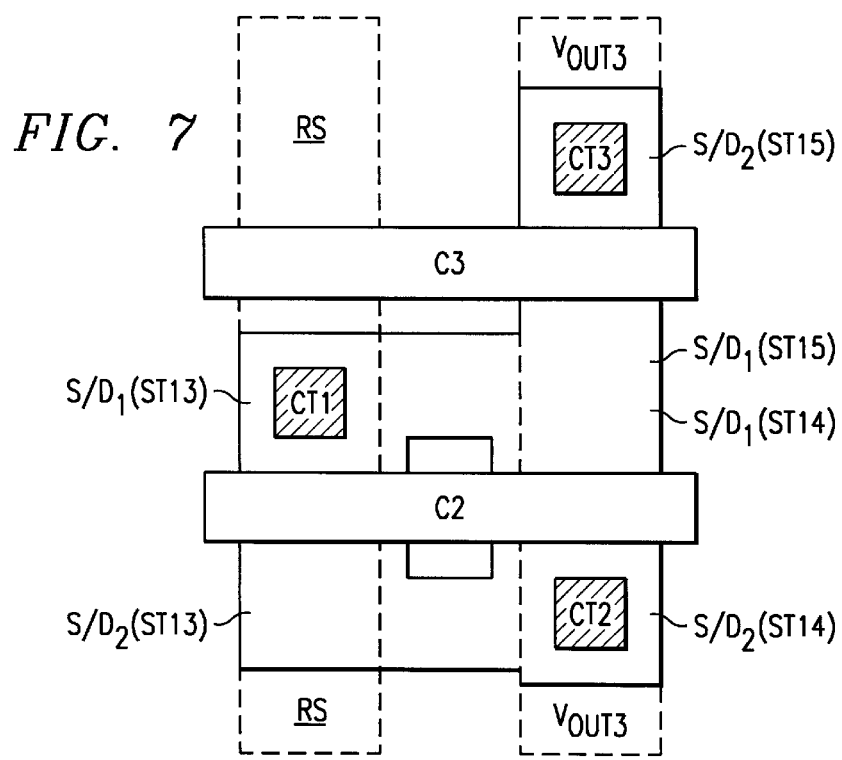
FIG. 7 illustrates a preferred layout of a set of three switching elements connected to a tap as shown schematically in FIG. 4.

In closing, FIG. 7 illustrates a plan view of a preferred semiconductor layout for forming a cell of DAC 30, where the cell depicts each of three switching transistors, and by way of example transistors ST13, ST14, and ST15 as relating to tap T1" in FIG. 4 are shown. More particularly, transistors ST13 and ST14 are formed in parallel, and form a square geometry. In addition, transistors ST13 and ST14 share the same gate conductor which corresponds to conductor C2. Further, note that the gate conductor extends over these transistors and may continue to overlie other transistors as well. Specifically in this regard, while DACs 20 and 30 have been illustrated with respect to a resistance string in a single dimension, it is contemplated that the present inventive teachings also apply to a DAC which includes a meandering resistor string which therefore extends in two dimensions. In this case, therefore, a typical configuration includes an array type configuration including the meander and switching elements such that a single row and column of the array are selected at a time, thereby providing an output voltage. In view of the possibility of this alternative configuration, conductor C2 (and C3) as shown in FIG. 7 extends to suggest that it also may traverse other paired and parallel-connected transistors in other columns of the array. Looking further to transistor ST13, it is shown to include a contact CT1, which is formed to connect its source/drain $S/D_1(ST13)$ downward to the underlying resistor string, RS, which in FIG. 7 is shown in phantom. Looking further to transistor ST14, it extends perpendicularly from the square geometry created by the paired and parallel-connected transistors. In addition, transistor ST14 is shown to include a contact CT2, which may be formed to connect its source/ drain S/D$_2$(ST14) to a conductor corresponding to the output node V$_{OUT3}$, which is preferably formed overlying the transistor and is also shown in phantom. Lastly looking to transistor ST15, its source/drain S/D$_1$(ST15) is essentially formed as the same region, and thereby is electrically connected, to the source/drain S/D$_1$(ST14) of transistor ST14. Further, the source/drain S/D$_2$(ST15) of transistor ST15 also includes an electrical contact CT3 for connecting that region to the overlying conductor corresponding to the output node V$_{OUT3}$. Lastly, given an appreciation of the geometry presented in FIG. 7, note further in the preferred embodiment that generally the source/drain regions have silicide reacted into them so that even though the conductance path may bend in various areas, a large majority of the resistance in the path is that in the channel under the gate, since the silicide provides very low resistance cladding on top of the diffusion.

From the above, it may be appreciated that the above embodiments provide numerous advantages over the prior art, many of which have been set forth above and additional ones of which will be appreciated by one skilled in the art In addition, while the present embodiments have been described in detail, various substitutions, modifications or alterations could be made to the descriptions set forth above without departing from the inventive scope. Indeed, some of these type of variations have been set forth above such as the use of the preceding teachings in either DACs or ADCs, and still others may be ascertained. As yet another example, therefore, while the illustrations have shown only a single channel DAC, the present inventive teachings may apply to a double channel DAC, whereby a single resistance string is used but provides tap voltages to dual independent switching networks and outputs. As still another example, while the preceding embodiments have shown either one or three levels of interpolations between a pair of resistor string taps, still other configurations of switching devices may be implemented to achieve still additional levels of interpolation. Moreover, while DAC 30 has been shown to include only four switching situations per tap, still other variations may be included in the control of the decoder to achieve still further varying outputs based on different inputs. As yet another example, while n-channel transistors have been shown in the various embodiments, an alternative structure may be formed using p-channel transistors. As a final example, while the illustrations have been directed to DACs with three or four inputs, the present teachings apply equally to DAC having greater or lesser input/output capacities. Thus, all of the preceding as well as other ascertainable examples should further illustrate the inventive scope, where that scope is defined by the following claims.

What is claimed is:

1. A data converter, comprising:
an input for receiving a digital word;
a string of series connected resistive elements, wherein the string comprises an integer number T of voltage taps;
an output for providing an integer number P of different analog voltage levels in response to the digital word, wherein the integer number P is greater than the integer number T;
a switching network comprising a plurality of switching elements coupled between the integer number T of voltage taps and the output;
a decoder for receiving the digital word and for enabling one or more of the switching elements, wherein a corresponding one of the integer number P of different analog voltage levels is output in response to the enabled one or more of the switching elements and the plurality of switching elements consists of an integer number S of switching elements, and wherein the integer number S equals approximately three times the integer number T of voltage taps;
wherein the integer number T of voltage taps are successively ordered;
wherein each voltage tap is operable to provide a corresponding tap voltage; and
wherein for each voltage tap:
the decoder in a first situation enables a first set of the switching elements to produce a first corresponding one of the different analog voltage levels equal to approximately the tap voltage;
the decoder in a second situation enables a second set of the switching elements to produce a second corresponding one of the different analog voltage levels equal to a voltage that is approximately the tap voltage plus 0.25 times a voltage difference between the tap voltage and a voltage at a next successive one of the voltage taps;
the decoder in a third situation enables a third set of the switching elements to produce a third corresponding one of the different analog voltage levels equal to a voltage that is approximately the tap voltage plus 0.50 times a voltage difference between the tap voltage and a voltage at a next successive one of the voltage taps; and
the decoder in a fourth situation enables a fourth set of the switching elements to produce a fourth corresponding one of the different analog voltage levels equal to a voltage that is approximately the tap voltage plus 0.75 times a voltage difference between the tap voltage and a voltage at a next successive one of the voltage taps.

2. A data converter, comprising:
an input for receiving a digital word;
a string of series connected resistive elements, wherein the string comprises an integer number T of voltage taps; and
an output for providing an integer number P of different analog voltage levels in response to the digital word, wherein the integer number P is greater than the integer number T;
a switching network comprising a plurality of switching elements coupled between the integer number T of voltage taps and the output;
a decoder for receiving the digital word and for enabling one or more of the switching elements, wherein a corresponding one of the integer number P of different analog voltage levels is output in response to the enabled one or more of the switching elements;
wherein for each of the voltage taps, the plurality of switching elements comprise a set of three switching elements connected between the voltage tap and the output to provide up to three parallel conductive paths between the voltage tap and the output corresponding to when any of the three switching elements is enabled;
wherein for each set of three switching elements, a first of the three switching elements is controlled to conduct by the decoder separately from a second and third of the three switching elements; and
wherein the second and third of the three switching elements are controlled to conduct at a same time by the decoder.

3. The converter of claim 2 wherein the string of series connected resistive elements comprises a meandering string extending in more than a single dimension.

4. The converter of claim 2 wherein the string of series connected resistive elements extends in a single dimension.

5. The converter of claim 2 wherein each of the plurality of switching elements comprises a p-channel field effect transistor.

6. The converter of claim 2:
   wherein the string of series connected resistors consists of an integer number R of resistive elements; and
   wherein the integer number P of different analog voltage levels equals approximately four times the integer number R of resistive elements.

7. The converter of claim 2 wherein for each set of three switching elements: the second and third of the three switching elements form a square geometry; and the first switching element extends perpendicularly from the square geometry.

8. The converter of claim 2 wherein each of the plurality of switching elements comprises a field effect transistor.

9. The converter of claim 2 wherein each of the plurality of switching elements comprises an n-channel field effect transistor.

10. The converter of claim 2 wherein each of the plurality of switching elements comprises an n-channel field effect transistor having a resistance value, when the transistor is enabled, which is on an order of ten to one hundred times larger than a resistance value of each of the resistive elements.

11. A method of operating a data converter comprising a string of series connected resistive elements, wherein the string comprises an integer number T of voltage taps, the method comprising:
   applying a bias across the string such that each of the voltage taps has a corresponding tap voltage;
   receiving a digital word at an input;
   responsive to the digital word, outputting an output analog voltage, wherein the output analog voltage corresponds to a voltage interpolated between the tap voltages of two of the voltage taps; and
   wherein the integer number T of voltage taps are successively ordered;
   wherein each voltage tap is operable to provide a corresponding tap voltage; and
   wherein the voltage interpolated between the tap voltages of the two of the voltage taps is selected from the group of voltages consisting of approximately the tap voltage at one of the two of the voltage taps, approximately the tap voltage at one of the two of the voltage taps plus 0.25 times a voltage difference between the tap voltage at the one of the two of the voltage taps and a voltage at a next successive one of the voltage taps, approximately the tap voltage at one of the two of the voltage taps plus 0.50 times a voltage difference between the tap voltage at the one of the two of the voltage taps and a voltage at a next successive one of the voltage taps, and approximately the tap voltage at one of the two of the voltage taps plus 0.75 times a voltage difference between the tap voltage at the one of the two of the voltage taps and a voltage at a next successive one of the voltage taps.

12. A method as defined in claim 11 wherein:
   the string of resistive elements comprises an integer number R of resistive elements; and
   an integer number P of different analog voltage levels are outputted in response to the digital word, wherein the integer number P is greater than the integer number R.

13. The digital converter of claim 12 wherein the integer number P equals an integer multiple times the integer number R.

14. The digital converter of claim 12 wherein the integer number P equals four times the integer number R.

* * * * *